(12) United States Patent
Babb

(10) Patent No.: US 8,797,017 B2
(45) Date of Patent: Aug. 5, 2014

(54) IMPEDANCE STABILIZATION

(75) Inventor: Samuel M. Babb, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 763 days.

(21) Appl. No.: 12/994,997

(22) PCT Filed: May 28, 2008

(86) PCT No.: PCT/US2008/064943

§ 371 (c)(1),
(2), (4) Date: Nov. 29, 2010

(87) PCT Pub. No.: WO2009/145763

PCT Pub. Date: Dec. 3, 2009

(65) Prior Publication Data

US 2011/0101950 A1    May 5, 2011

(51) Int. Cl.
*G05F 5/00* (2006.01)
*H03H 19/00* (2006.01)

(52) U.S. Cl.
CPC .................................. *H03H 19/008* (2013.01)
USPC ........................................................ 323/300

(58) Field of Classification Search
USPC ......... 323/265, 266, 282, 284, 285, 299, 300, 323/234, 237, 273, 274
See application file for complete search history.

(56) References Cited

U.S. PATENT DOCUMENTS

| | | | |
|---|---|---|---|
| 7,477,048 B2 * | 1/2009 | Nakatani ....................... | 323/285 |
| 2002/0140407 A1 * | 10/2002 | Hwang ......................... | 323/207 |
| 2005/0073860 A1 * | 4/2005 | Yang et al. ..................... | 363/16 |
| 2005/0110474 A1 * | 5/2005 | Ortiz et al. .................... | 323/282 |
| 2005/0269999 A1 * | 12/2005 | Liu et al. ....................... | 323/222 |
| 2006/0226823 A1 * | 10/2006 | O'Meara ....................... | 323/283 |
| 2007/0216387 A1 * | 9/2007 | Matsuo et al. ................ | 323/282 |

FOREIGN PATENT DOCUMENTS

| | | |
|---|---|---|
| CN | 2468084 Y | 12/2001 |
| JP | 1992121059 | 4/1992 |
| JP | 10032977 | 3/1998 |
| KR | 19970047290 | 7/1999 |
| KR | 2005010244 | 1/2005 |

OTHER PUBLICATIONS

International Search Report and Written Opinion, dated Feb. 25, 2009, 11 pages.
Jinbo, et al; A Self Excited Regulated Switching Power Supply; Computer and Information Engineering College of Hohai University (Changzhou 213022).
International Searching Authority; International Search Report and the Written Opinion; PCT/US2008/064943;Mailing Date: Feb. 25, 2009.

* cited by examiner

*Primary Examiner* — Adolf Berhane
*Assistant Examiner* — Jeffrey Gblende

(57) ABSTRACT

One embodiment of an impedance stabilizer for use with a switching voltage regulator supplied by a source of an electrical voltage has an impedance and a switch controllable to permit current from a source to flow through the impedance. Control circuitry to operate the switch cyclically with a controlled duty cycle is responsive to variations in the voltage of the source having a frequency lower than a cycle rate of the switch to increase the duty cycle of the switch as the voltage of the source increases.

14 Claims, 3 Drawing Sheets

IMPEDANCE STABILIZATION

BACKGROUND

Power supplies for electronic devices commonly use a two-stage system, in which incoming utility power, typically 100 to 250 V AC, 50-60 Hz, is first transformed and rectified to produce about 12 V DC power (which may be smoothed to a greater or lesser extent) and is then regulated to produce a sufficiently smooth and stable DC supply for the load device. The regulator may be a switching converter such as a DC-DC "buck converter," in which the power intake is regulated by rapidly switching on and off an intake transistor or other switch.

These converters are typically regulated to produce a constant output voltage into a resistive load, and thus effectively a constant output power, at least in the short term. If the supply voltage increases, the duty cycle of the switch is reduced, reducing the average current flow into the converter. As measured at frequencies low compared with the switching speed of the converter, this produces the effect of a negative real marginal input impedance. In general, impedance may be purely resistive, purely reactive, or complex with both resistive and reactive parts. If the combined negative input impedance of all the switching converters in a given power supply circuit outweighs the positive real impedances in the part of the circuit from the first-stage transformer/rectifier to the switching converters, the circuit can become unstable. Since the only positive real impedance may be the output impedance of the first-stage transformer/rectifier, that is a very real possibility. It has previously been proposed to stabilize such circuits by including a resistive and/or capacitive load impedance alongside the switching converter to provide additional positive real impedance. However, a predominantly resistive stabilizing load wastes power. A predominantly capacitive stabilizing load requires a substantial capacitance if the stabilizing impedance is to be effective. At low frequencies, typically below a few kHz, the physical size of the capacitor becomes a significant problem for the circuit designer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding and are incorporated in and constitute a part of this specification, illustrate embodiments of the invention and together with the description serve to explain the principles of the invention, without being limiting.

In the drawings.

DETAILED DESCRIPTION

Reference will now be made in detail to various embodiments illustrated in the accompanying drawings.

Figure 1:
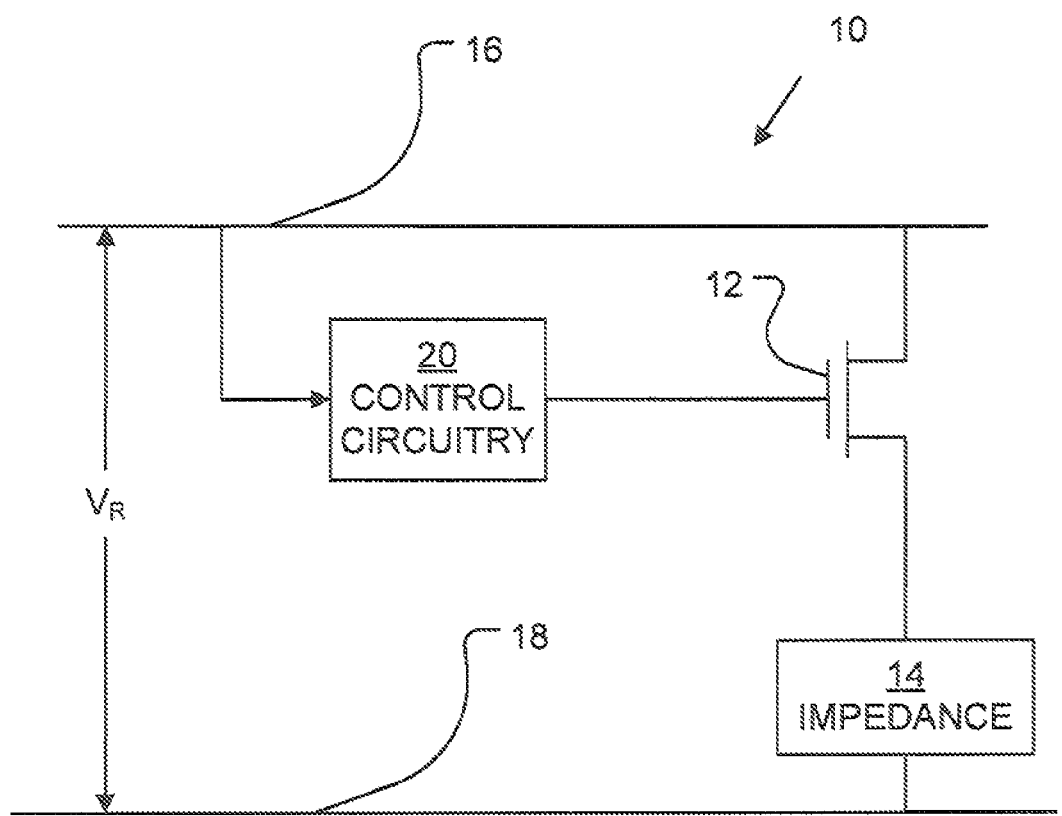
FIG. 1 is a circuit diagram of a first embodiment of an impedance correction circuit.

Referring to FIG. 1 of the accompanying drawings, a first embodiment of an impedance correction circuit, indicated generally by the reference numeral 10, comprises a switch 12 and an impedance 14 that in operation are connected between power supply rails 16 and 18. The impedance 14 may be resistive, reactive, or a complex impedance with both resistive and reactive components. The switch 12 is controlled by control circuitry 20. In use, the control circuitry 20 is responsive to variations in the voltage $V_R$ between the power supply rails 16 and 18 to control the switch 12 so that, as the voltage $V_R$ increases, the duty cycle (the proportion of time for which the switch is on), and thus the average current flowing through the impedance 14, increase. This produces the effect of a positive impedance drawing current between the power supply rails 16 and 18.

Figure 2:
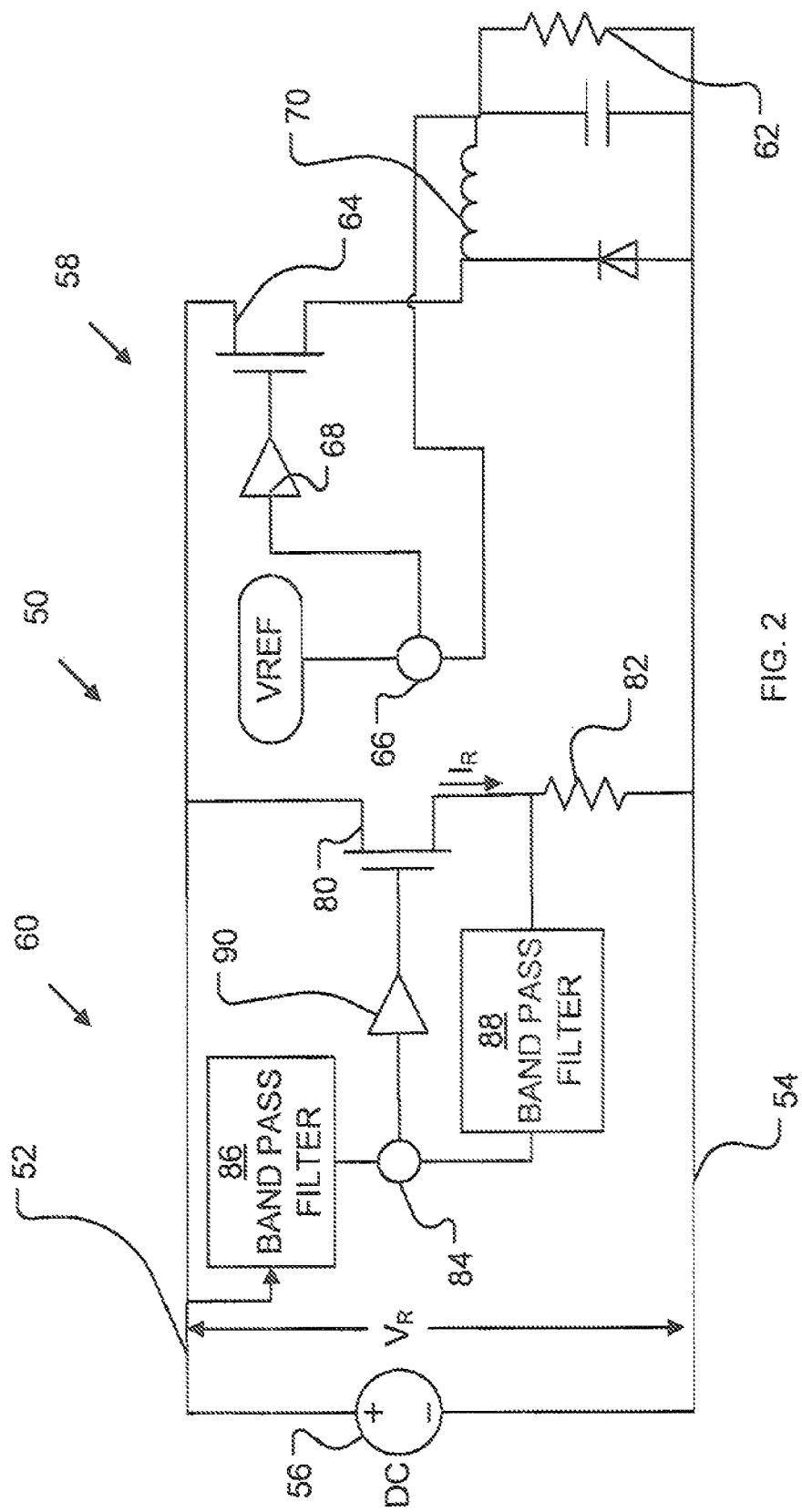
FIG. 2 is a circuit diagram of part of an embodiment of a power supply circuit including a second embodiment of an impedance correction circuit.

Referring now to FIG. 2, one embodiment of a power supply circuit, indicated generally by the reference numeral 50, comprises a pair of power rails 52 and 54, to which are connected a DC power source 56, a load device 58, and a second form of impedance stabilizer 60.

The DC power source 56 may be, by way of example, an AC to DC converter such as a rectifier or transformer rectifier that produces an imperfectly smoothed DC voltage $V_R$ between the power supply rails 52, 54. Such DC power sources are well known and, in the interests of conciseness, power source 56 is not described in more detail here.

In the embodiment shown in FIG. 2, load device 58 is a "buck converter" that draws current from the power supply rails 52, 54 and supplies a lower but more constant output voltage to a load, represented by resistor 62. The buck converter 58 shown in FIG. 2 comprises a switch 64, controlled by control circuitry in the form of a comparator 66 and an amplifier 68, that alternately charges an inductor 70 and permits the inductor to discharge.

In use, in steady-state operation of the resistive load 62, the comparator 66 compares the output voltage from the inductor 70 with a reference voltage, so as to maintain the voltage, current, and power supplied to the resistive load 62 constant within a desired tolerance. As a result, the comparator 66 controls the duty cycle of switch 64 so as to draw similarly constant power from the DC power supply 56 through the power supply rails 52, 54. Therefore, if the DC voltage $V_R$ increases, the duty cycle of switch 64 and the average current drawn by the buck converter 58 decrease, and vice versa, producing a negative marginal apparent marginal resistance. If the negative marginal resistance of the buck converter 58 is greater than the positive output resistance of the DC power supply 56, the power supply circuit 50 could become unstable and could oscillate or resonate undesirably. If several load devices 58 with negative marginal impedance are connected to a single power supply 56, this undesirable unstable condition may be even more likely to occur.

In the circuit 50 shown in FIG. 2, the impedance stabilizer 60 provides a positive marginal impedance that compensates for the negative marginal impedance of the load device 58.

The impedance stabilizer 60 comprises a switch 80, which in the embodiment shown in FIG. 2 is a field effect transistor, in series with a resistor 82 between the power supply rails 52, 54. A comparator 84 compares the voltage across the resistor 82 (which represents the current $I_R$ drawn by the impedance stabilizer 60) with the supply voltage $V_R$. The output of comparator 84 may drive the switch 80 through a suitable amplifier 90.

Both inputs to the comparator 84 are fed through band pass filters 86, 88 so that the impedance stabilizer 60 is responsive only to voltage fluctuations in a desired range of frequencies, typically below a few kilohertz, at which conventional stabilization by a capacitive load would require an inconveniently large capacitor. The circuit components are selected so that the switching rate of switch 80 under control of comparator 84, and the switching rate of switch 64 in the load device 58, are fast compared with the upper cutoff of band pass filters 86, 88. Thus, comparator 84 does not respond to the rapid fluctuations caused by the switches, and perceives the current $I_R$ averaged over the duty cycle of the switch 80.

The band pass filters may have an upper cut-off at least an order of magnitude, preferably, at least three orders of magnitude, lower than a switching rate of the switch 80 in normal operation. In an example, the impedance stabilizer may be directed primarily to stabilizing the 100-120 Hz fluctuations of full-wave rectified AC utility power, and the switching rate of the switch 80 may be over 1.2 kHz, preferably, over 120 kHz. In a simple feedback circuit, the switching cycle time, as well as the duty cycle within the switching cycle, of the switch 80 may vary, but a maximum cycle rate is typically determined by the response times of the components in the feedback loop.

The comparator 84 is configured to control the duty cycle of the switch 80 so that the current $I_R$ is related to the voltage $V_R$ by the relationship:

$$k_1 V_R - k_2 I_R = k_3$$

where $k_1$, $k_2$, and $k_3$ are suitable constants.

The apparent marginal impedance of the impedance stabilizer 60 is $$dV_R/dI_R = k_2/k_1, \text{ which is constant.}$$

The marginal impedance is selected to be sufficient that the overall marginal impedance of the power supply circuit 50 in regions of operation is positive.

Because only the marginal impedance, and not the average impedance, is of concern, $k_3$ may be selected to reduce the actual current draw. For example, $I_R$ may be set to zero at the highest value of $V_R$ that is expected to occur in the normal range of use of the circuit 50.

The impedance stabilizer 60 may be less efficient than those described below, because the primary impedance is the resistor 82 which is dissipative, but is very simple.

Figure 3:
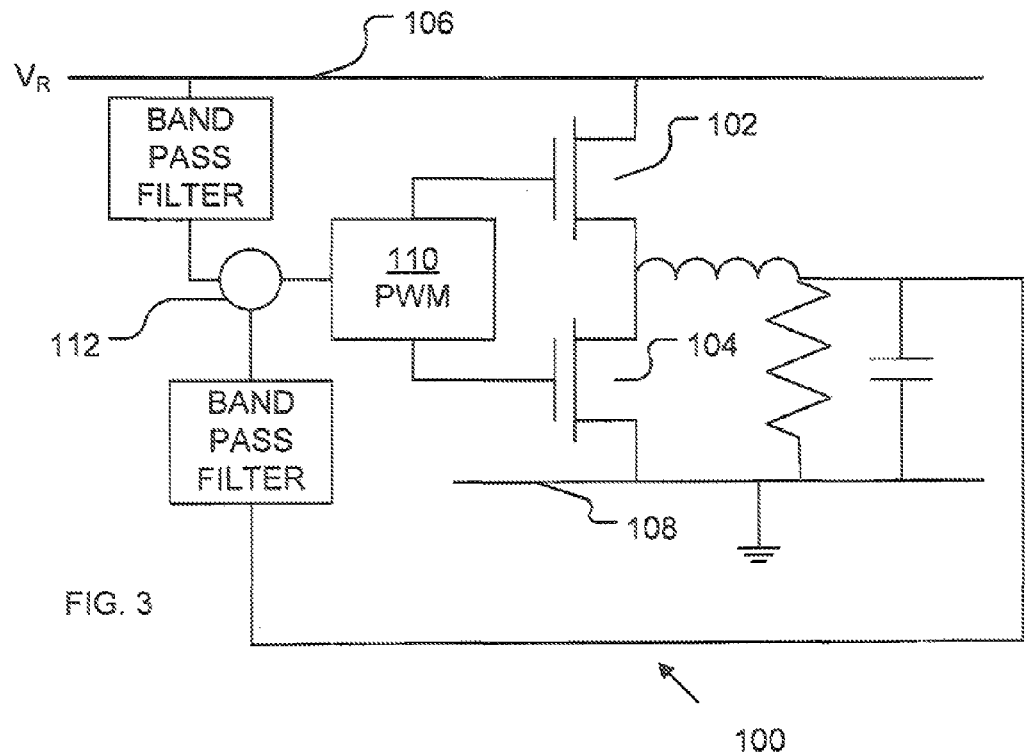
FIG. 3 is a circuit diagram of a third embodiment of an impedance correction circuit.

Referring now to FIG. 3, a third form of impedance stabilizer, indicated generally by the reference numeral 100, comprises two switches 102, 104 connected in series between power supply rails 106, 108. The switches 102, 104 are controlled by a pulse width modulation (PWM) circuit 110 that turns the switches on alternately. The PWM circuit 110 is controlled by comparator 112, which compares the supply voltage $V_R$ with the voltage at an output node between the two switches 102, 104. The output node is provided with an LCR circuit similar to that in the buck converter 58 shown in FIG. 2. As may be seen by comparing buck converter 58 with impedance stabilizer 100, the second switch 104 may be replaced with a reverse-biased diode.

The impedance stabilizer 100 can be manufactured very economically, because most of its circuitry is a standard buck converter.

Figure 4:
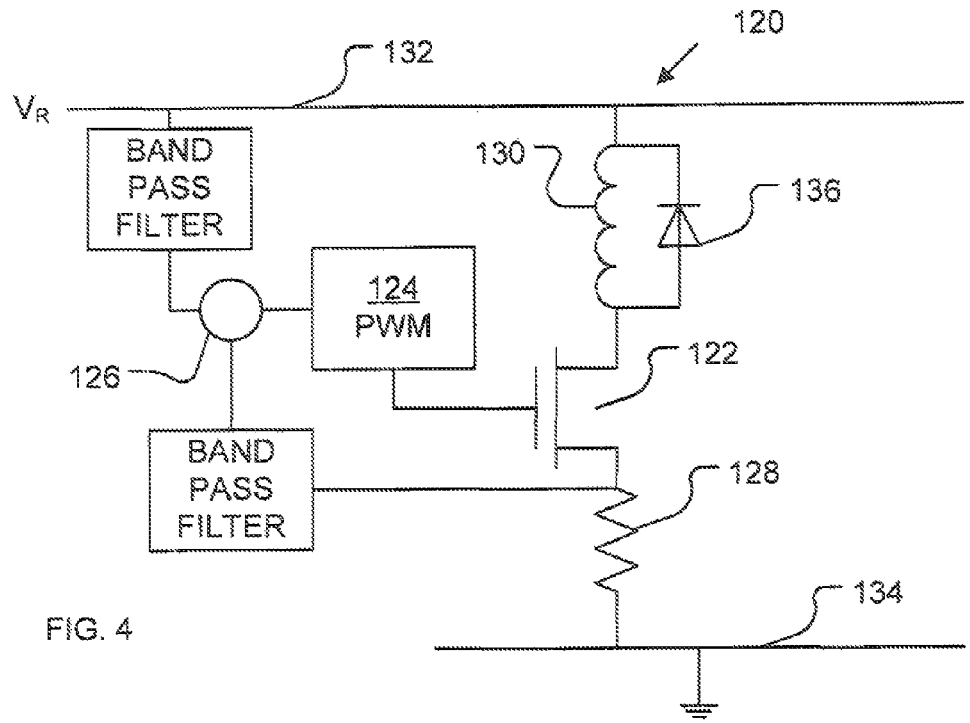
FIG. 4 is a circuit diagram of a fourth embodiment of an impedance correction circuit.

Referring now to FIG. 4, a fourth form of impedance stabilizer, indicated generally by the reference numeral 120, comprises a switch 122 controlled by a PWM circuit 124 that is controlled by a comparator 126, which compares the supply voltage $V_R$ with the voltage at an output of the switch 122. The switch 122 is connected in series with a resistor 128 and an inductor 130 between power supply rails 132, 134. A reverse-biased diode 136 is connected in parallel with inductor 130.

In this configuration, the resistor 128 serves primarily as a current sense input to the comparator 126 for the current through the switch 122, and may have a low resistance to reduce resistive heating and dissipation of power. The primary impedance is the inductor 130. When the switch 122 is turned on, the inductor 130 stores energy, and when the switch 122 is turned off, the inductor discharges stored energy back into the power supply rail 132. Thus, if properly configured the impedance stabilizer 120 can be almost lossless, because the power that it draws is mostly regenerated.

Various modifications and variations can be made to the illustrated embodiments without departing from the spirit or scope of the invention.

For example, although several embodiments of impedance stabilizer have been described, the skilled reader will understand how features from different embodiments may be combined to produce alternative embodiments. The impedance stabilizer 10, 100, or 120 may be used instead of the impedance stabilizer 60 in the power supply circuit 50 shown in FIG. 2, and any of the impedance stabilizers may be used with other forms of power supply circuit.

An impedance stabilizer may be combined in a single module with a load circuit having negative marginal input impedance, and the impedance stabilizer may then be configured so that the module as a whole has non-negative marginal impedance, or has a negative marginal impedance sufficiently low that it will reliably be stabilized by the positive output impedance of any likely power supply 56.

Where a power supply circuit comprises more than one load circuit, individual load circuits may be provided with associated impedance stabilizers, or one impedance stabilizer may be provided for a plurality of load circuits, or another arrangement may be used.

Thus, it is intended that the description cover the modifications and variations of this invention provided they come within the scope of the appended claims and their equivalents.

What is claimed is:

1. An impedance stabilizer for use with a switching voltage regulator supplied by a source of an electrical voltage, comprising:
   an impedance;
   a switch controllable to permit current from a DC power source to flow through the impedance, wherein the DC power source supplies a device having in operation negative apparent marginal impedance; and
   control circuitry to operate the switch cyclically with a controlled duty cycle, the control circuitry being responsive to variations in the voltage of the DC power source, the voltage of the DC power source having a frequency lower than a cycle rate of the switch to increase the duty cycle of the switch as the voltage of the DC power source increases so that a positive apparent marginal impedance is maintained in a circuit portion comprising an output of the DC power source and an input of the supplied device.

2. The impedance stabilizer according to claim 1, wherein said impedance is predominantly reactive.

3. The impedance stabilizer according to claim 1 or claim 2, wherein the control circuitry is unresponsive to variations in the voltage of the DC power source less than an order of magnitude slower than the cycle rate of the switch.

4. The impedance stabilizer according to claim 1 or claim 2, wherein the control circuitry is unresponsive to variations in the voltage of the DC power source less than three orders of magnitude slower than the cycle rate of the switch.

5. The impedance stabilizer according to claim 1 or 2, wherein the control circuitry comprises the switch, a resistor in series with the switch, and a comparator controlling the switch so that a current detected as a voltage across the resistor tracks a voltage applied to the switch.

6. A power supply comprising:
a source of DC power,
a device supplied by the source of DC power and having in operation negative apparent marginal impedance, and
an impedance stabilizer operative to maintain a positive apparent marginal impedance in a circuit portion comprising an output of the source of DC power and an input of the supplied device, the impedance stabilizer further comprising:
an impedance;
a switch controllable to permit current from the source of DC power to flow through the impedance; and
control circuitry to operate the switch cyclically with a controlled duty cycle, the control circuitry being responsive to variations in the voltage of the source of DC power, the voltage having a frequency lower than a cycle rate of the switch to increase the duty cycle of the switch as the voltage of the source of DC power increases.

7. The power supply according to claim 6, wherein the supplied device is a switching regulator operative to deliver substantially constant voltage to a load.

8. A method of stabilizing a power supply to a device having negative apparent marginal impedance, comprising:
providing an impedance across the power supply to the device, wherein the device has in operation negative apparent marginal impedance;
permitting current from the power supply to flow intermittently through the impedance by operating a switch cyclically with a controlled duty cycle, wherein the power supply has a DC power source; and
in response to variations in a voltage of the power supply having a frequency low compared with a cycle rate of the switch, increasing the duty cycle of the switch as a voltage of the DC power source increases and decreasing the duty cycle of the switch as the voltage of the DC power source decreases so that a positive apparent marginal impedance is maintained in a circuit portion comprising an output of the DC power source and an input of the supplied device.

9. The method according to claim 8, comprising responding only to variations in the voltage of the DC power source at least an order of magnitude slower than the cycle rate of the switch.

10. The power supply of claim 6, wherein the duty cycle of the switch is controlled such that the current drawn by the impedance stabilizer $I_R$ is related to the voltage of the source $V_R$ by the relationship $K_1 V_R - K_2 I_R = K_3$, wherein $K_1$, $K_2$ and $K_3$ are constants and wherein the positive apparent marginal impedance is $dV_R/dI_R = K_2/K_1$.

11. The power supply according to claim 6, wherein said impedance is predominantly reactive.

12. The power supply according to claim 6 or claim 11, wherein the control circuitry is unresponsive to variations in the voltage of the source less than an order of magnitude slower than the cycle rate of the switch.

13. The power supply according to claim 6 or claim 11, wherein the control circuitry is unresponsive to variations in the voltage of the source less than three orders of magnitude slower than the cycle rate of the switch.

14. The power supply according to claim 6 or claim 11, wherein the control circuitry comprises the switch, a resistor in series with the switch, and a comparator controlling the switch so that a current detected as a voltage across the resistor tracks a voltage applied to the switch.

* * * * *

UNITED STATES PATENT AND TRADEMARK OFFICE
CERTIFICATE OF CORRECTION

| | |
|---|---|
| PATENT NO. | : 8,797,017 B2 |
| APPLICATION NO. | : 12/994997 |
| DATED | : August 5, 2014 |
| INVENTOR(S) | : Samuel M. Babb |

It is certified that error appears in the above-identified patent and that said Letters Patent is hereby corrected as shown below:

In the Claims

In column 4, line 63, in Claim 5, delete "2," and insert -- claim 2, --, therefor.

Signed and Sealed this
Tenth Day of March, 2015

Michelle K. Lee
*Deputy Director of the United States Patent and Trademark Office*